US011018673B2

(12) United States Patent
Patel et al.

(10) Patent No.: US 11,018,673 B2
(45) Date of Patent: *May 25, 2021

(54) MULTI-MODULUS FREQUENCY DIVIDERS

(71) Applicant: Microchip Technology Incorporated, Chandler, AZ (US)

(72) Inventors: Pancham R. Patel, Irvine, CA (US); Esmael Heidari, Mission Viejo, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/740,278

(22) Filed: Jan. 10, 2020

(65) Prior Publication Data

US 2020/0153439 A1    May 14, 2020

Related U.S. Application Data

(63) Continuation of application No. 16/270,208, filed on Feb. 7, 2019, now Pat. No. 10,581,436.

(Continued)

(51) Int. Cl.
*H03K 21/02* (2006.01)
*H03K 21/10* (2006.01)
(Continued)

(52) U.S. Cl.
CPC ............ *H03K 21/10* (2013.01); *H03K 21/02* (2013.01); *H03K 21/026* (2013.01); *H03K 21/08* (2013.01); *H03K 19/20* (2013.01); *H03L 7/0992* (2013.01)

(58) Field of Classification Search
CPC ...... H03K 21/02; H03K 21/026; H03K 21/08; H03K 21/10; H03K 21/12
(Continued)

(56) References Cited

U.S. PATENT DOCUMENTS

| 6,385,276 B1 * | 5/2002 | Hunt, Jr. .............. H03K 23/667 377/47 |
| 8,565,368 B1 | 10/2013 | Chen et al. |
| 9,018,988 B2 | 4/2015 | Abdel-Haleem et al. |
| 2003/0030471 A1 * | 2/2003 | Wang ................... H03K 23/667 327/115 |

(Continued)

OTHER PUBLICATIONS

Eissa et al., "A Technique for Robust Division Ratio Switching in Multi Modulus Dividers with Modulus Extension", Microelectronics (ICM), 2010 International Conference on, IEEE, Piscataway, NJ, USA, Dec. 19, 2010, pp. 84-87, XP031856156.

(Continued)

*Primary Examiner* — William Hernandez
(74) *Attorney, Agent, or Firm* — TraskBritt (57) ABSTRACT

Various embodiments relate to multi-modulus frequency dividers, devices including the same, and associated methods of operation. A method of operating a multi-modulus divider (MMD) may include receiving, at the MMD, an input signal at a first frequency. The method may also include generating, via the MMD, an output signal at a second, lower frequency based on a divisor value. Further, the method may include receiving, at the MMD, an integer value. Moreover, the method may include setting the divisor value equal to the integer value in response to a current state of the MMD matching a common state for the MMD, wherein the MMD is configured to enter the common state regardless of the divisor value.

20 Claims, 8 Drawing Sheets

Related U.S. Application Data

(60) Provisional application No. 62/754,166, filed on Nov. 1, 2018.

(51) Int. Cl.
*H03K 21/08* (2006.01)
*H03L 7/099* (2006.01)
*H03K 19/20* (2006.01)

(58) Field of Classification Search
USPC .................................................. 327/115, 117
See application file for complete search history.

(56) References Cited

U.S. PATENT DOCUMENTS

2004/0165691 A1* 8/2004 Rana ..................... H03L 7/1976
377/48
2016/0308536 A1 10/2016 Cali et al.

OTHER PUBLICATIONS

Elkholy et al., "A 2.0-5.5 GHz Wide Bandwidth Ring-Based Digital Fractional-N PLL with Extended Range Multi-Modulus Divider", IEEE Journal of Solid-State Circuits, IEEE Service Center, Piscataway, NJ, USA, vol. 15, No. 8, Aug. 1, 2016, pp. 1771-1784, XP011617999.
International Search Report for International Application No. PCT/US2019/056099, dated Jan. 8, 2020, 5 pages.
International Written Opinion for International Application No. PCT/US2019/056099, dated Jan. 8, 2020, 9 pages.

* cited by examiner

| | | C1 | C2 | C3 | C4 | C5 | C6 | C7 | C8 | C9 | C10 | C11 | C12 | C13 | C14 |
|---|---|---|---|---|---|---|---|---|---|---|---|---|---|---|---|
| R1 | N=4 | 91 | 12 | 22 | AA | 8A | 09 | 29 | A1 | | | | | | |
| | Mout | | | | | | | | | | | | | | |
| | Fout | | | | | | | | | | | | | | |
| | Mout_1 | | | | | | | | | | | | | | |
| | Fout | | | | | | | | | | | | | | |
| R2 | N=5 | 91 | 52 | 42 | 02 | 22 | AA | 8A | 09 | A1 | | | | | |
| R3 | N=6 | 95 | 14 | 24 | A0 | 80 | 02 | 22 | AA | 8A | 09 | A5 | | | |
| R4 | N=7 | 95 | 54 | 44 | 04 | 24 | A0 | 80 | 02 | 09 | AA | 8A | 09 | 29 | A5 |
| R5 | N=2 | 99 | 19 | 29 | A9 | | | | | | | | | | |
| R6 | N=3 | 99 | 59 | 49 | 09 | 29 | A9 | | | | | | | | |

|  | ON=0 | | ON=1 | |
|---|---|---|---|---|
| Cells From Left To Right | Applied N=63 | Reset | Applied N=63 | Reset |
| N<0> 1 | 1 | No | 1 | No |
| N<1> 2 | 1 | No | 1 | No |
| N<2> 3 | 1 | Yes (ONB) | 1 | No |
| N<3> 4 | 1 | Yes (ONB) | 1 | No |
| N<4> 5 | 1 | Yes (ONB) | 1 | No |
| N<5> 6 | 1 | Yes (N=63) | 1 | Yes (N=63) |
| N<6> 7 | 0 | Yes (N=63) | 0 | Yes (N=63) |

*FIG. 7B*

MULTI-MODULUS FREQUENCY DIVIDERS

CROSS-REFERENCE TO RELATED APPLICATIONS

This application is a continuation of U.S. patent application Ser. No. 16/270,208, filed Feb. 7, 2019, now U.S. Pat. No. 10,581,436, issued Mar. 3, 2020, which application claims the benefit under 35 U.S.C. § 119(e) to the Nov. 1, 2018 filing date of U.S. Patent Provisional Application No. 62/754,166, the disclosures of each of which are hereby incorporated herein in its entirety by this reference.

FIELD

The present disclosure relates generally to multi-modulus frequency dividers, and more specifically, to multi-modulus dividers of phase-locked loops for generating local oscillator signals to transmit and receive wireless signals. Yet more specifically, various embodiments relate to a multi-modulus divider and an associated control circuit for applying a divisor value to the multi-modulus divider during a state that is common for all possible divisor values.

BACKGROUND

Frequency dividers are commonly used to reduce a frequency of a clock signal in a circuit by an integer (e.g., 2, 3, 4, and so forth). For example, in some electronic systems, a frequency divider may down-convert a signal from a first frequency to a second, lower frequency.

A frequency divider may be part of a phase-locked loop (PLL), which may generate an output signal having a desired frequency. A PLL may include a voltage controlled oscillator (VCO) that may generate a local oscillator (LO) signal having a frequency dependent on a control voltage, which may be generated by a phase detector/charge pump/loop filter (PFD/CP/LPF). The PFD/CP/LPF may generate the control voltage by comparing a reference signal to the LO signal (e.g., via feedback). Thus, the LO signal may be prevented from drifting to a different frequency value.

The reference signal may have a lower frequency than the LO signal, and thus, the PLL may use a frequency divider such that the frequency of the LO signal is a multiple of the frequency of the reference signal. In some applications, a processor may control the frequency divider such that the frequency divider may divide the LO signal by various divisor values. Thus, the PLL may generate the LO signal for transmitting and/or receiving at a plurality of frequencies.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawing could be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. For example, data, instructions, commands, information, signals, bits, and symbols that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, or a subprogram, without limitation. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Various electronic applications may require a phase-locked loop (PLL) for generating a local oscillator (LO) signal. For example, a WiFi chip may require an LO signal for receiving and transmitting WiFi signals. As will be appreciated by a person having ordinary skill in the art, it is often desirable to reduce noise (e.g., voltage controlled oscillator (VCO) noise, sigma delta quantization noise, reference signal noise) associated with a PLL to, for example, improve sensitivity, improve a packet error ratio (PER), and/or reduce transmit leakage.

A PLL may include a feedback control system that compares phases of two input signals and produces an error signal that is proportional to a difference between the phases. The error signal may be low pass filtered and used to drive a voltage-controlled oscillator (VCO), which generates an output signal having a frequency. The output signal may be fed through a frequency divider back to the input of the control system, thereby producing a negative feedback loop. If the output frequency drifts, the phase error signal may increase, driving the frequency of the output signal in the opposite direction so as to reduce the error. Thus, the output may be locked to the frequency of the signal at the other input, which is usually derived from a crystal oscillator (i.e., a stable frequency source). Accordingly, frequency dividers may be deployed to reduce the crystal oscillator frequency for use as a reference signal and within the feedback loop.

Figure 1:
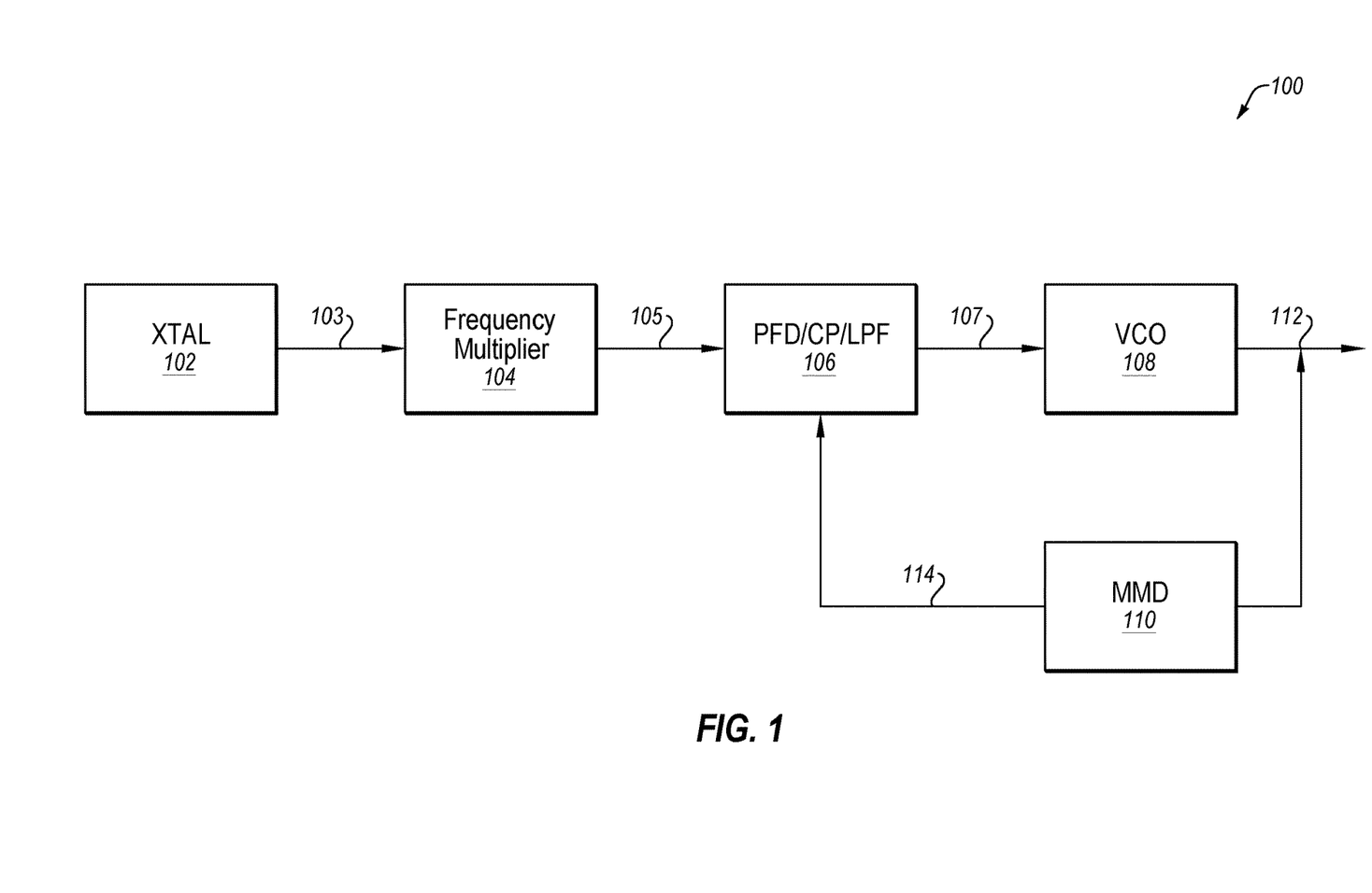
FIG. 1 is a block diagram of a system including a multi-modulus frequency divider, according to one or more embodiments of the disclosure.

FIG. 1 is a block diagram of a device 100, according to one or more embodiments of the disclosure. Device 100, which may include a PLL, includes a crystal oscillator (XTAL) 102, a frequency multiplier (e.g., a frequency doubler) 104, a processing unit 106, a voltage controlled oscillator (VCO) 108, and a multi-modulus divider (MMD) 110. For example, processing unit 106 may include a phase detector/charge pump/loop filter (PFD/CP/LPF).

For example, XTAL 102 may be configured to generate a reference signal 103 having a frequency (e.g., 40 megahertz (MHz)), and frequency multiplier 104 may receive the signal, increase (e.g., double) the frequency of the signal (e.g., from 40 MHz to 80 MHz), and convey a signal 105 to processing unit 106. Processing unit 106 may receive signal 105 and output a signal 107 to VCO 108. For example, processing unit 106 may include a phase detector, a charge pump, and/or a filter (e.g., a loop filter). VCO 108 may be configured to receive signal 107 and generate an output signal 112 (e.g., also referred to herein as a "local oscillator signal" or a "LO signal"). As described more fully below, in some embodiments, MMD 110 may include a cascaded MMD including a plurality of unit cells coupled in series. Further, in some embodiments, MMD 110 may include or may be coupled to a control circuit for providing a divisor value to MMD 110 (e.g., based on a state of MMD 110).

MMD 110 may receive output signal 112 and generate a feedback signal 114 having a frequency less than a frequency of output signal 112. More specifically, for example, MMD 110 may be configured to divide by divisor values N within a division range (e.g., $N=2^n$ to $(2^{n+1}-1)$), where n is equal to the number of unit cells of the MMD. For example, if n=4, an MMD may divide by divisor value N within a range of 16 to 31. As a frequency of output signal 112 varies from channel to channel and a frequency of output signal 112 and a frequency of reference signal 103 vary from system to system, divisor value N may vary accordingly. For wide band, multi-standard, software defined, and cognitive radios, operation of a frequency divider (e.g., MMD 110) over a large range of N may be desirable.

In one example wherein a divisor value N is equal to 125, output signal 112 may have a frequency of 5 gigahertz (GHz) and feedback signal 114 may have a frequency of 40 megahertz (MHz). In another example wherein a divisor value N is equal to 80, output signal 112 may have a frequency of 5 GHz and feedback signal 114 may have a frequency of 62.5 MHz. Feedback signal 114 may be received by processing unit 106.

One option for reducing noise of a PLL is to increase a reference frequency (e.g., a frequency of reference signal 103) of the PLL. However, increasing the reference frequency (e.g., doubling the reference frequency) may, in turn, require that a greater division range be provided to a multi-modulus divider (MMD) of the PLL. In some cases, requiring a greater division range may require crossing a division range boundary (e.g., transitioning across a $2^n-1$ to $2^n$ boundary, such as a 31-32 boundary, a 63-64 boundary or a 127-128 boundary, without limitation). More specifically, for example, increasing a reference frequency of a PLL may require that a divisor value transition from a value of 63 or less to a value of 64 or more, or from a value of 127 or less to a value of 128 or more. Conventional MMDs may not perform accurately across unstable division range boundaries and the PLL may lose its lock and fail.

Various embodiments disclosed herein relate to multi-modulus dividers (MMDs) configured to accurately reduce a frequency of a signal based on a randomly generated divisor value (also referred to herein as a "division ratio" or a "division value"), even when the divisor value crosses a division range boundary (e.g., when the divisor value crosses the 63-64 boundary or the 127-128 boundary). More specifically, according to some embodiments, the divisor value of an MMD may be changed only during an MMD state that is common to all possible divisor values, and, therefore, the MMD may be prevented from entering an unknown state.

Various MMDs described herein may be utilized in a variety of applications, such as in frequency synthesizers, PLLs, fractional-N frequency synthesizers, receivers, transmitters, and/or transceivers. The MMDs may also be utilized as part of, for example, a radio, including a multi-standard or multi-mode radio, cognitive radio, or software defined radio (SDR).

Figure 2:
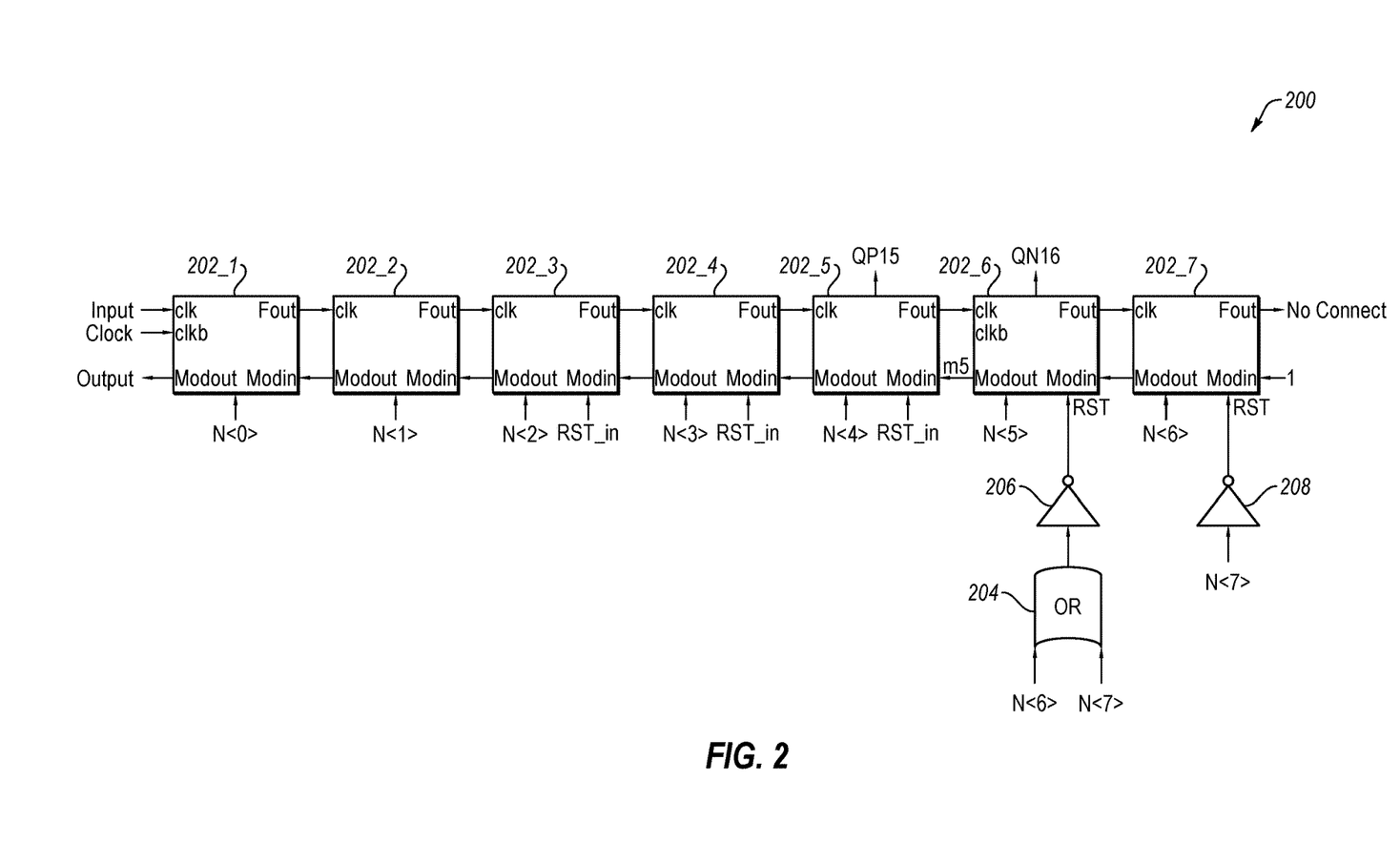
FIG. 2 is a circuit diagram of a cascaded multi-modulus frequency divider, in accordance with one or more embodiments of the disclosure.

FIG. 2 is a circuit diagram of a cascaded multi-modulus divider (MMD) 200, according to various embodiments of the disclosure. MMD 200 includes unit cells 202_1-202_7 coupled in series. Each unit cell 202 includes an input signal clk, an output signal Fout, a modulus input Modin, and a modulus output Modout. During a contemplated operation, in each division cycle, first unit cell 202_1 may receive a frequency input clk and convey frequency output Fout to unit cell 2022, which may then convey frequency output Fout to unit cell 202_3 as frequency input clk, and so on until the last unit cell 202_7 receives a frequency input clk. Moreover, last unit cell 202_7 may generate modulus output Modout and transmit the same to unit cell 202_6. Modulus output Modout may be re-clocked by unit cell 202_6 and sent to unit cell 202_5, and so on, until unit cell 202_1 generates an Output.

Each unit cell 202 may also be configured to receive an input control signal N<0:6> and perform a frequency division (e.g., divide by 2 or 3) based on control signal N<0:6>. Control signal N<0:6>, which may be generated via a control or decoder circuit (not shown), may include bits of a programming divisor word that select the value of a divisor value. For example, if a divisor value N is selected to be 127, the binary representation of N (i.e., 01111111) may be provided to unit cells 102_1-102_7. More specifically, in this case, N<0>=0, N<1>=1, N<2>=1, N<3>=1, N<4>=1, N<5>=1, N<6>=1, and N<7>=1.

In some embodiments, each unit cell 202 may include a divide by ⅔ unit cell. As will be appreciated, in these embodiments, if input control signal N for unit cell 202_1 is a logical 0, unit cell 202_1 may divide an input frequency by 2. Other the other hand, if input control signal N for unit cell 202_1 is a logical 1, unit cell 202_1 may divide an input frequency by 3. Conventional MMDs are known in the art, and thus some operational details of MMDs may not be discussed herein.

MMD 200 further includes OR gate 204 and inverters 206 and 208. OR gate 204 may be configured to receive N<6> and N<7>, inverter 206 may be configured to receive an output of OR gate 204, and inverter 208 may be configured to receive N<7>. An output of inverter 206 may be coupled to unit cell 202_6 as an RST signal, and an output of inverter 208 may be coupled to unit cell 202_7 as an RST signal.

Figure 3:
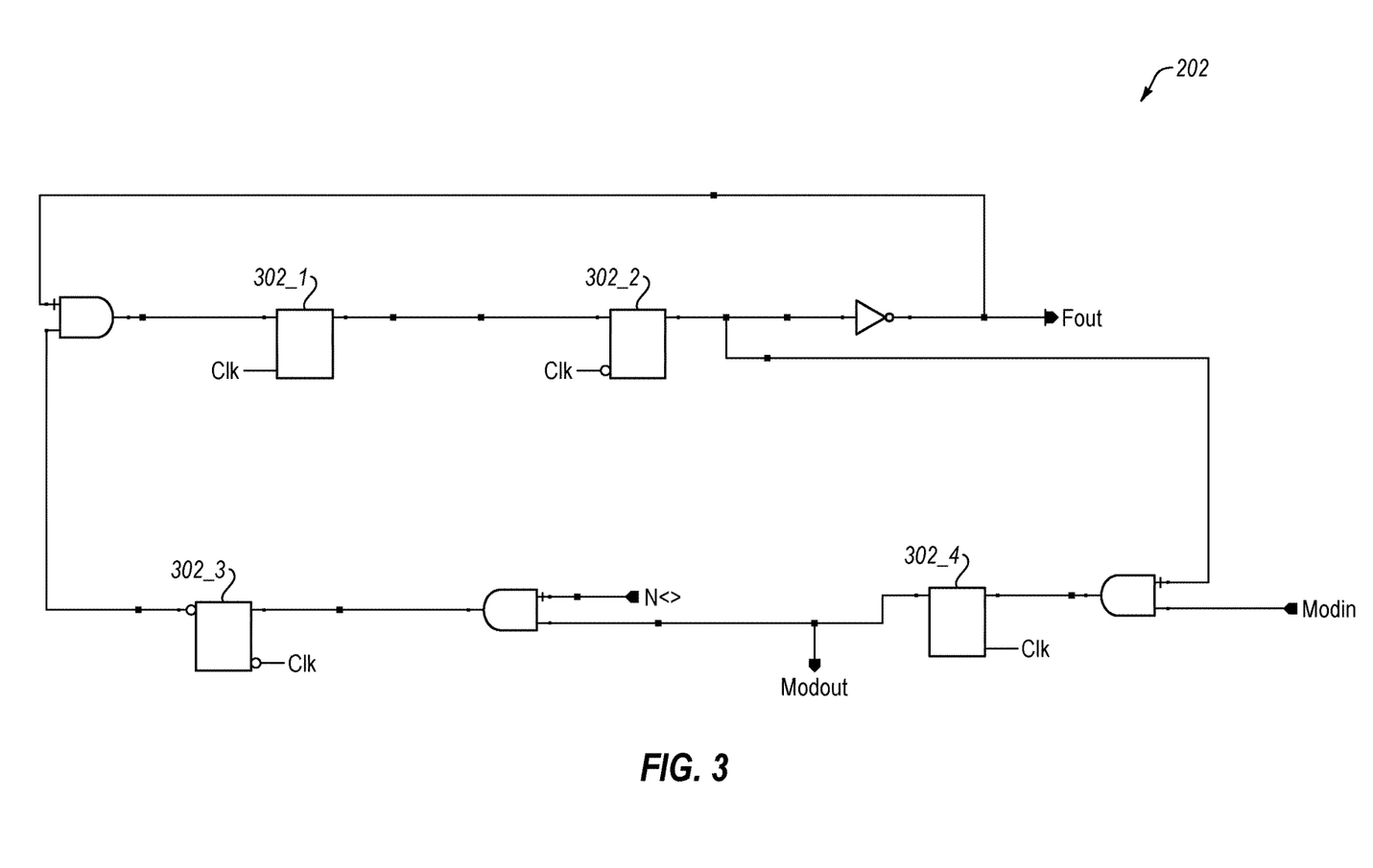
FIG. 3 is a schematic of an example unit cell of a multi-modulus frequency divider, according to one or more embodiments of the disclosure.

As will be understood by a person having ordinary skill in the art, each unit cell 202 may include four digital flip-flops, two triggered by a positive clock edge, and two triggered by a negative clock edge. FIG. 3 is a schematic of an example unit cell 202 including flip-flops 302_1-302_4. In this example, flip-flops 302_1 and 3024 may be triggered by a positive clock edge and flip-flops 302_2 and 302_3 may be triggered by a negative clock edge.

Figure 4:
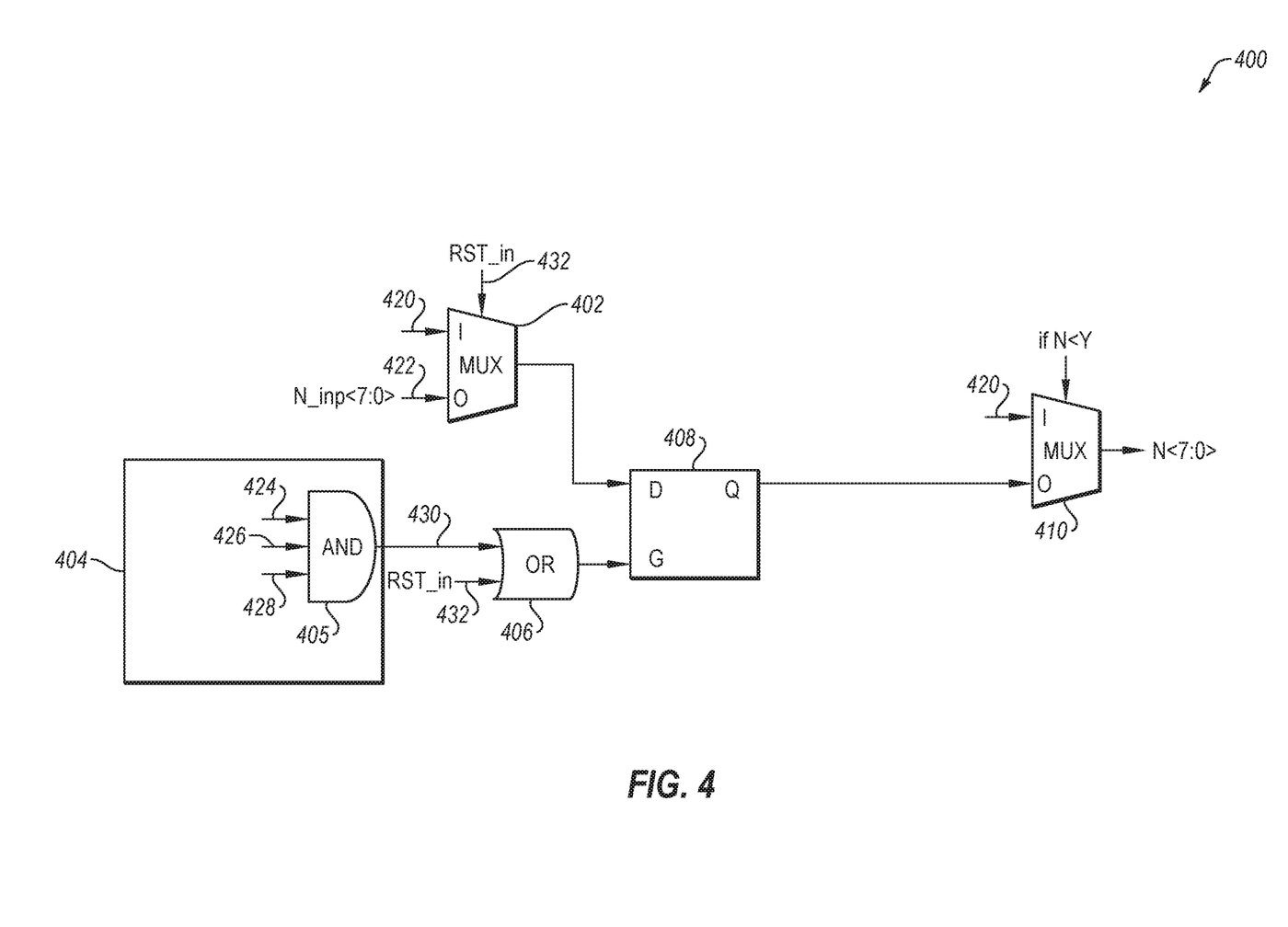
FIG. 4 depicts a control circuit, in accordance with one or more embodiments of the disclosure.

FIG. 4 depicts a circuit 400 that may be used to generate a divisor value. Circuit 400, which may also be referred to herein as a "control circuit," includes a multiplexer 402, state monitoring circuit 404, OR gate 406, a latch 408, and a multiplexer 410. Multiplexer 402 is configured to receive a default divisor value 420 and an input divisor value 422. Default divisor value 420 may include any suitable divisor value, such as 63, 127 or 255, without limitation. Further, input divisor value 422 may include a generated divisor value (e.g., a divisor value generated via a control or decoder circuit). As described more fully below, input divisor value 422 may only be applied to multiplexer 410 if a current state of an associated MMD (MMD 200 of FIG. 2) matches a known common state for the MMD. Input divisor value 422 is illustrated as being 8 bits in length, however this is not meant to be limiting in any way.

Multiplexer 402 is further configured to receive a reset signal 432 (RST in). In response to reset signal 432 being high, multiplexer 402 may output default divisor value 420 to latch 408. In response to reset signal 432 being low, multiplexer 402 may output input divisor value 422 to latch 408.

State monitoring circuit 404 may be configured to determine a current state of an MMD, and output a signal 430 in a high state (e.g. logical 1) if the determined current state matches a known common state for the MMD. A common state is a state that the MMD may enter regardless of an applied divisor value. If the determined current state does not match a known common state for the MMD, signal 430 may be in a low state (e.g., logical 0). More specifically, according to various embodiments, state monitoring circuit 404 may monitor two or more unit cells of the MMD (e.g., MMD 200), and output signal 430 in a high state (e.g. logical 1) if a determined current state of the two or more unit cells matches a known common state for two unit cells of the MMD.

As a more specific example, a known common state (e.g. state "AB") for two unit cells of the MMD may be determined (e.g., via testing (e.g., trial and error)). Further, state monitoring circuit 404 may monitor two or more unit cells of the MMD, and in response to the two or more unit cells transitioning to the known common state (e.g., state AB), signal 430 may transition from low to high. Further, in response to the two or more unit cells transitioning from the known common state (i.e., state AB) to another, non-common state (e.g., state YZ), signal 430 may transition from high to low.

In some embodiments, state monitoring circuit 404 may include an AND gate 405 configured to receive signals 424, 426, and 428. As non-limiting examples, signal 424 may include signal m5 shown in FIG. 2, signal 426 may include signal QN16 shown in FIG. 2, and signal 428 may include signal QP15 shown in FIG. 2. One or more of signals m5, QN16, QP15 may be sensed to determine a state of an MMD (e.g., MMD 200).

For example, each of signals 424, 426, and 428 may be associated with one or more flip-flops (see flip-flops 302 of FIG. 3) of one or more unit cells 202 of an associated MMD 200. In some embodiments, signals 424, 426, and 428 may all be high (e.g., logical 1) if the associated MMD (e.g., MMD 200 of FIG. 2) is in a known common state. Thus, signal 430 may be high only if the MMD is in a common state. State monitoring circuit 404 is provided as an example state monitoring circuit, and other circuits for monitoring a state of an MMD and outputting a signal in response to a detected state are within the scope of the present disclosure.

According to the logic of circuit 400, a signal at input D of latch 408 may be applied to output Q of latch 408 if signal 430 and/or reset signal 432 is high. If neither signal 430 nor reset signal 432 is high, a signal at input D of latch 408 may not be applied to output Q of latch 408.

Figure 5:
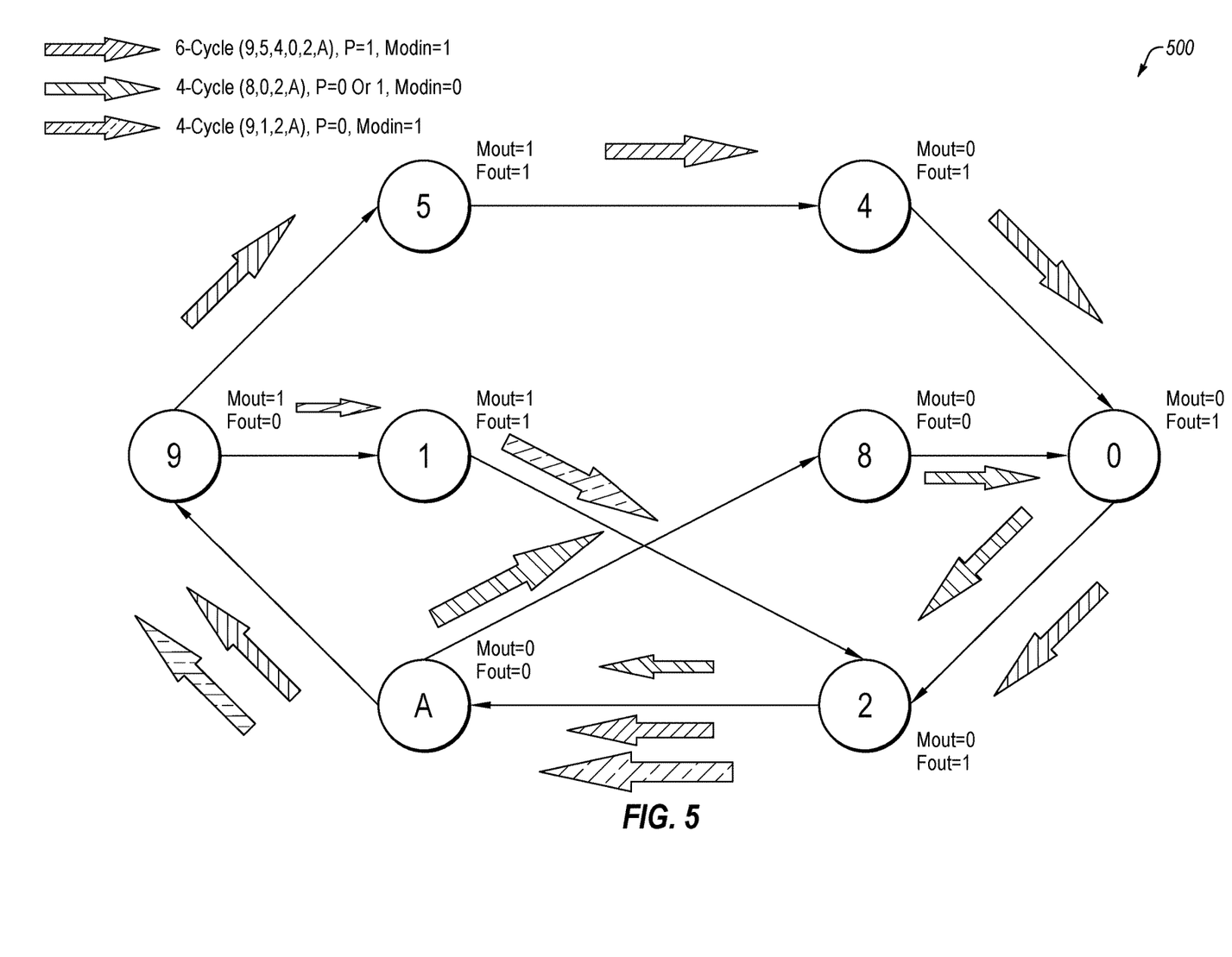
FIG. 5 illustrates a state diagram of a multi-modulus frequency divider, according to various embodiments of the present disclosure.

FIG. 5 is a state diagram 500 of a unit cell 202 of an MMD 200. In one contemplated scenario wherein N<7:0> provided to the unit cell is logic 1 (e.g., divide by 3; i.e., P=1) and modulus input Modin=1, the unit cell of the MMD may transition through the following states: 9, 5, 4, 0, 2, A (e.g., for each clock cycle edge). Thus, after six clock edges (or three complete clock cycles), the unit cell may return to state 9. As shown in FIG. 5, modulus output Mout=1 at states 9, 1, and 5. Thus, for three complete clock cycles, modulus output Mout transitions from 0 to 1 once, and, therefore, a successful divide-by-3 operation has occurred.

In another contemplated scenario, wherein N<7:0> provided to the unit cell is logic 0 (e.g., divide by 2; i.e., P=0) and modulus input Modin=0, the unit cell may transition through the following states: 8, 0, 2, A. In yet another contemplated scenario, wherein N<7:0> provided to the unit cell is logic 0 (e.g., divide by 2) and modulus input Modin=1, the unit cell may transition through the following states: 9, 1, 2, A.

Figure 6:
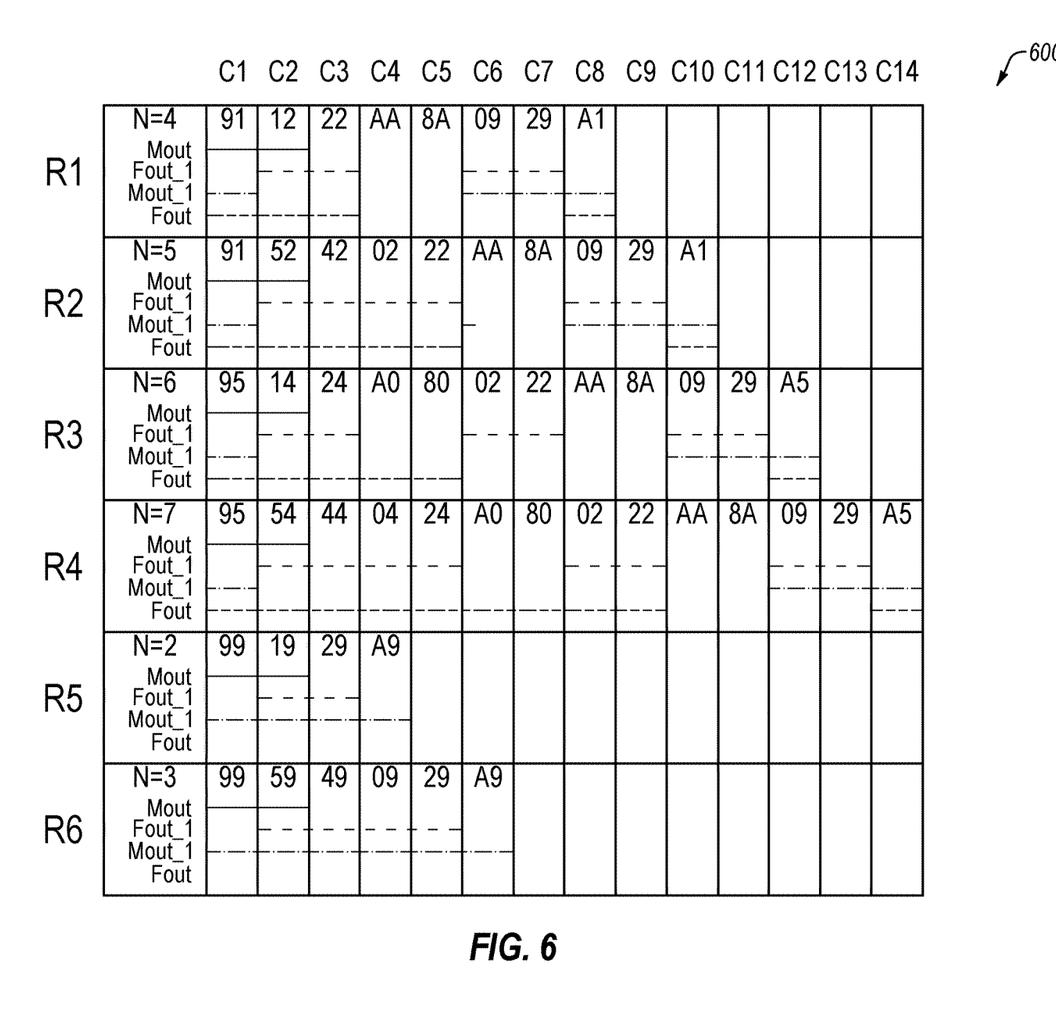
FIG. 6 is a table depicting example states of two unit cells of a multi-modulus frequency divider, in accordance with one or more embodiments of the disclosure.

FIG. 6 is a table 600 depicting various example states of two unit cells 202 of an MMD 200. Table 700 includes rows R1-R6 and columns C1-C14. Each row is associated with a divisor value (e.g., N=4, N=5, N=6, and so on). Further, each column represents a state for the two unit cells 202. For example, in row R1, column C1, the first unit cell 202 is in state 9 and the second cell 202 is in state 1. Thus, the state of the MMD represented in row R1, column C1 may be referred to as "91." The number 9 in hexadecimal is 1001, which represents the values of the four flip-flops (e.g., flip-flops 302 of FIG. 3) in the first unit cell 202. Further the number 1 in hexadecimal is 0001, which represents the values of four flip-flops (e.g., flip-flops 302 of FIG. 3) in the second unit cell 202.

Subsequently, in row R1, column C2, the first unit cell is in state 1 and the second cell is in state 2. This state of the MMD may be referred to as "12". Further, in row R1, column C3, the first unit cell is in state 2 and the second cell is in state 2. This state of the MMD may be referred to as "22". Each unit cell may transition through N*2 states and then return to an initial state. Thus, for N=4, each unit cell may transition through 8 states, and then return to an initial state.

As shown in FIG. 6, state "12", for example occurs if divisor value N=4, but state "12" does not occur if N=5. Thus, if N were to change from 4 to 5 while the MMD is in state "12", the MMD would enter an unknown state. In contrast, state "29" is common to each row. In other words, regardless of the value of N, state "29" may occur. Stated another way, regardless of a divisor value applied to the MMD, two unit cells 202 of the MMD 200 will at some stage enter state 29. Thus, according to various embodiments of the disclosure, during state "29", a value of N may be changed. State 29 is thus a known common state as described above.

In a contemplated scenario wherein a divisor value is equal to 2, 3, 4, 5, 6, or 7, modulus output Mout=1 may occur every N*2 half cycles or N full cycles. Further, common state "29" may occur every modulus output Mout when the divisor value is equal to 4, 5, 6, or 7. However, for a divisor value of 2 or 3, a common state may only occur once every 3rd modulus output Mout output. Thus, according to some embodiments, if the divisor value transitions from a value of 4, 5, 6, or 7 to a value of 2 or 3, or if the divisor value transitions from a value of 3 to a value of 2, or vice versa, additional processing may be performed to prevent the MMD from transitioning to an unknown state.

With reference to FIGS. 2 and 4, a contemplated operation of circuit 200 and circuit 400 will now be described. Initially, reset signal 432 is high, and default divisor value 420, which in this example has a value of 63 (i.e. N=63), is applied to input D of latch 408. Further, because reset signal 432 is high, an output of OR gate 406 is high, and thus latch 408 may pass default divisor value 420 to output Q of latch. In some embodiments, N may have a lower threshold of 32, and therefore, in these embodiments, Y may have a value of 32. Moreover, because N is greater than Y, multiplexer 410 may output default value 420 as N<7:0>.

Further, in response to a trigger signal (e.g., timing signal), reset signal 432 may go low, and divisor value 422 may be applied to input D of latch 408. Moreover, state monitoring circuit may output a signal indicative of whether or not MMD 200 is in a known common state, as described above. If MMD 200 is not in a known common state, signal 430 is low. Further, because reset signal 432 is also low, the output of OR gate 406 is low, and thus latch 408 may not pass divisor value 422 to output Q of latch. On the other hand, if MMD 200 is in a known common state (e.g., 29), signal 430 is high, the output of OR gate 406 is high, and thus latch 408 may pass divisor value 422 to output Q of latch. Moreover, assuming divisor value 422 is greater than Y, multiplexer 410 may output divisor value 422 as N<7:0>. In some embodiments, if N<Y (e.g., N<32), multiplexer 410 may output default value 420 as N<7:0>.

In contrast to conventional devices and methods, a divisor value of MMD 200 may only be changed during a state that is common to all possible divisor values for MMD 200, and, therefore, MMD 200 may be prevented from entering an unknown state.

Figure 7A:
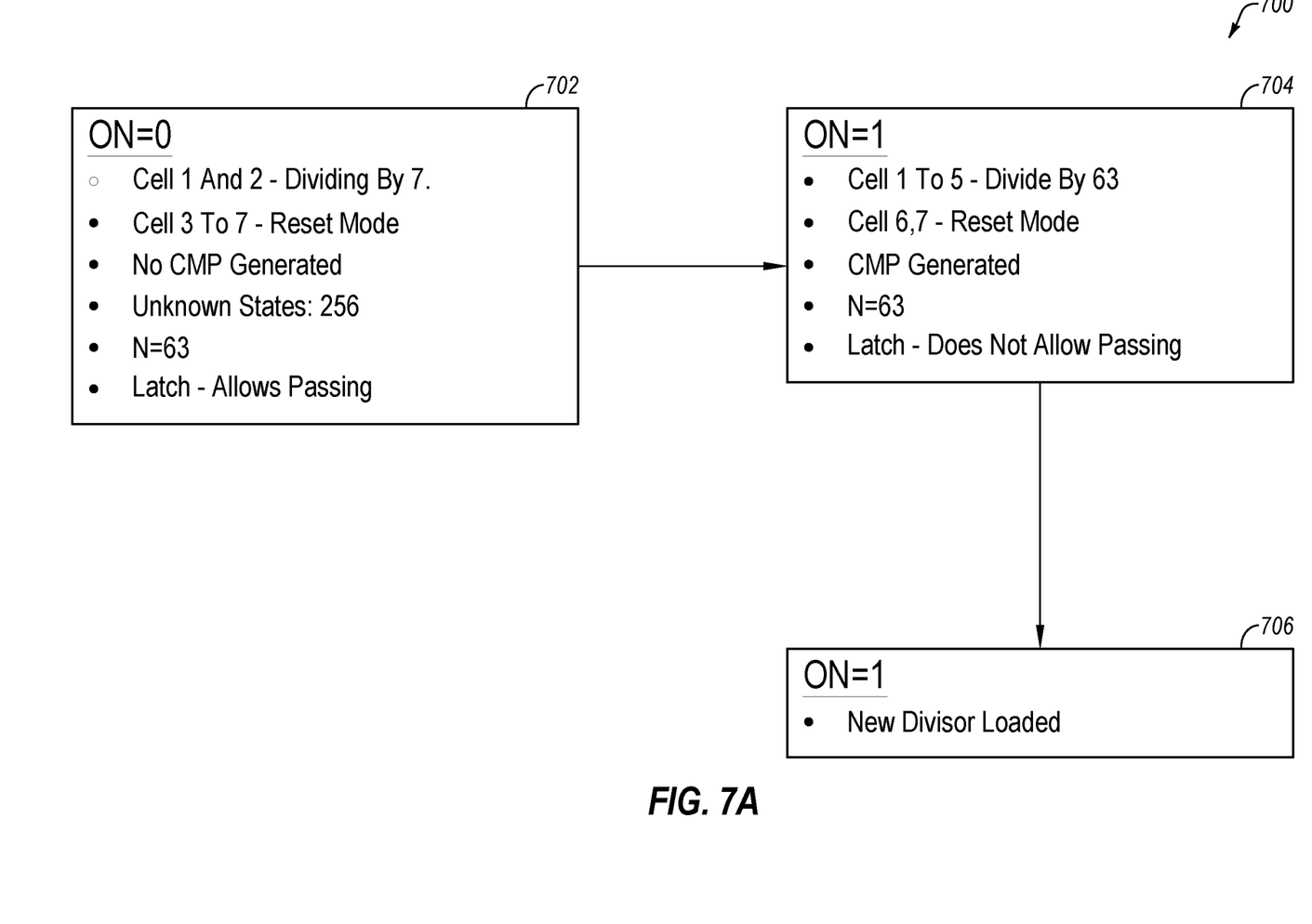
FIG. 7A illustrates an example flow of a multi-modulus frequency divider during startup, according to one or more embodiments of the disclosure.
Figure 7B:
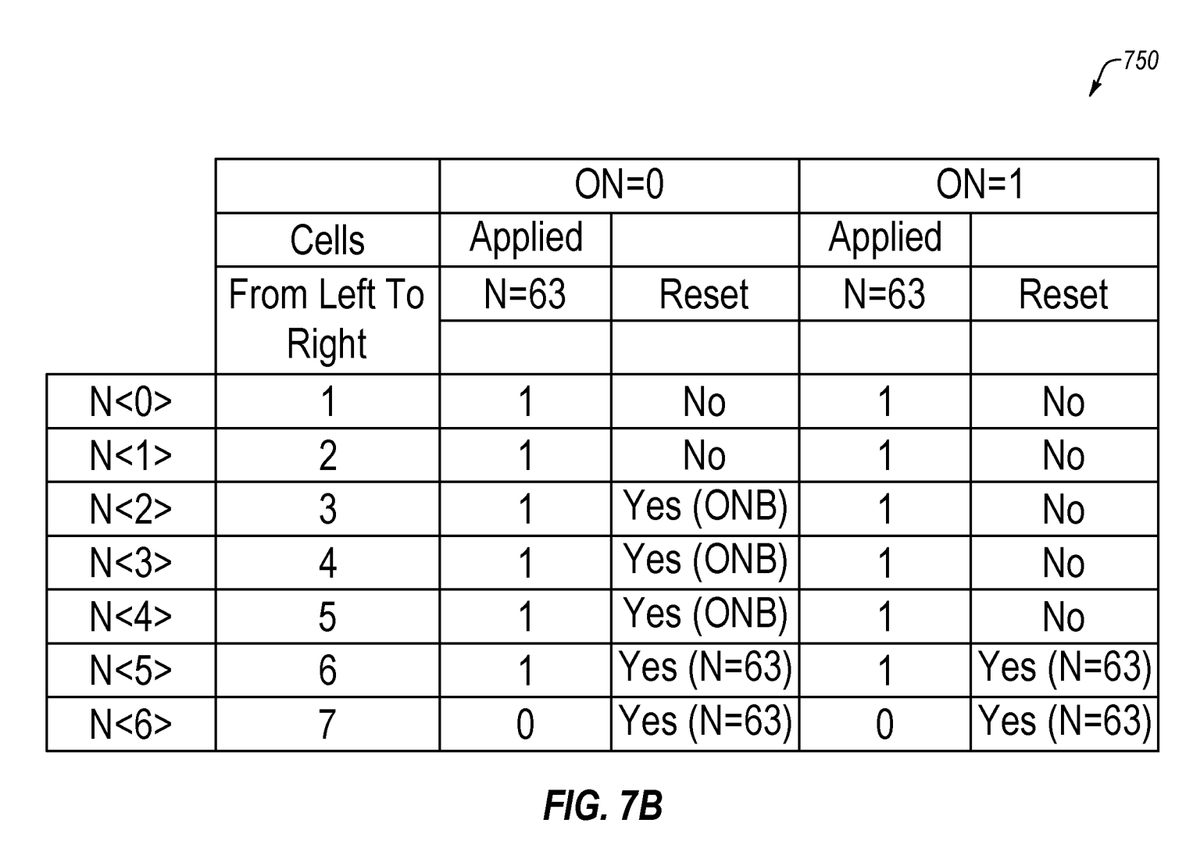
FIG. 7B shows a truth table for a multi-modulus frequency divider during startup, in accordance with one or more embodiments of the disclosure.

FIG. 7A is a diagram of an example flow 700 of an MMD 200 during startup, in accordance with one or more embodiments of the disclosure. FIG. 7B depicts a truth table 750 associated with the MMD 200 during startup. In these and other embodiments, at least a portion of flow 700 may be an example of an operation of device 100, circuit 200, and/or circuit 400, as described herein. Alternately or additionally, flow 700 may be performed by any suitable system, apparatus, or device. Although illustrated with discrete blocks, the steps and operations associated with one or more of the blocks of flow 700 may be divided into additional blocks, combined into fewer blocks, or eliminated, depending on the desired implementation.

Flow 700, which is described with reference to FIGS. 2, 4, and 7A, may begin at block 702. At block 702, wherein ON=0 (i.e., a reset is applied), reset signal 432 is high, unit cells 202_1 and 202_2 are dividing by, for example, 7, and cells 202_3-201_7 are in a reset mode. Further, signal 430 is low, signal 432 is high, and latch 408 may pass a signal from input D to output Q, which signal is default divisor value 420.

At block 704, after a time duration, ON=1, ON_BAR ("ONB")=0, reset signal 432 is low, unit cells 202_1-202_5 are dividing by 63, and cells 202_6 and 201_7 are in the reset mode. Further, a low (i.e., logical 0) compare signal ("CMP") (e.g., signal 430) is generated. Moreover, signal 432 is low, and latch 408 may not pass a signal from input D to output Q, and thus the output Q remains at the default divisor value 420.

At block 706, ON=1, ONB=0, reset signal 432 is low, and a new divisor value 422 may be received (e.g., at multiplexer 402). Further, depending on a state of a generated compare signal CMP (e.g., signal 430) (i.e., based on a comparison of a current state of MMD 200 to a known common state (e.g., 29), latch 408 may or may not pass new divisor value 422 from input D to output Q.

In some embodiments, a value of N may be limited. For example, N may be limited to a range of 32-255. In other embodiments, N may be less than 32 and/or greater than 255.

Modifications, additions, or omissions may be made to flow 700 without departing from the scope of the present disclosure. For example, the operations of flow 700 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

In addition to other benefits and advantages, as described herein, various embodiments of the disclosure may allow for a reference frequency used by a PLL to be increased (e.g., doubled), which may reduce noise (e.g., VCO noise, sigma-delta quantization noise) associated with the PLL. Further, various embodiments, may reduce on-board cost and improve device quality via enhanced sensitivity, enhanced packet error ratio, and reduced transmit leakage. Moreover, according to various embodiments, a MMD may perform division effectively and accurately, and the MMD may be prevented from entering unknown modes (digital states). According to at least some embodiments, the MMD may not require additional power in comparison to conventional devices.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

We claim:

1. A method of operating a multi-modulus divider, the method comprising:
   receiving, at a multi-modulus divider (MMD), an input signal at a first frequency;
   generating, via the MMD, an output signal at a second, lower frequency based on a divisor value;
   receiving, at the MMD, an integer value; and
   setting the divisor value equal to the integer value in response to a current state of the MMD matching a common state for the MMD, the MMD configured to enter the common state regardless of the divisor value.

2. The method of claim 1, further comprising detecting a current state of the MMD.

3. The method of claim 2, wherein detecting the current state of the MMD comprises sensing at least one signal within the MMD.

4. The method of claim 2, further comprising:
   comparing the current state of the MMD to the common state;
   generating, via a first logic gate, a first digital signal in response to the current state matching the common state; and
   generating, via the first logic gate, a second, different digital signal in response to the current state not matching the common state.

5. The method of claim 4, further comprising generating, via a second logic gate, a third digital signal in response to receipt of at least one of the first digital signal and a reset signal, the third digital signal configured to enable the divisor value to be set equal to the integer value.

6. The method of claim 1, further determining the common state being 29 for two unit cells of the MMD.

7. The method of claim 1, further comprising setting the divisor value equal to a second integer value in response to receipt of a reset signal.

8. A device, comprising:
   a multi-modulus frequency divider (MMD); and
   a control circuit coupled to the MMD and configured to:
      detect a state of the MMD; and
      set a divisor value of the MMD equal to an integer value in response to the state of the MMD matching a common state for the MMD, the MMD configured to enter the common state regardless of a value of the divisor value.

9. The device of claim 8, wherein the control circuit includes a state monitoring circuit configured to detect the state of the MMD.

10. The device of claim 9, wherein the state monitoring circuit includes an AND gate having a number of inputs coupled to the MMD.

11. The device of claim 10, wherein the control circuit includes:
    an OR gate configured to receive an output of the AND gate and a reset signal;
    a first multiplexer configured to receive integer value and a default divisor value;
    a latch configured to receive an output of the OR gate and an output of the first multiplexer; and
    a second multiplexer configured to receive an output of the latch and the default divisor value.

12. The device of claim 8, further comprising:
    a voltage controlled oscillator (VCO) having an output coupled to an input of the MMD; and
    a processing unit having an input coupled to an output of the MMD and an output coupled to an input of the VCO.

13. The device of claim 8, wherein the common state is 29 for two unit cells of the MMD.

14. A method of operating a multi-modulus divider, the method comprising:
    receiving a generated divisor value at the multi-modulus divider (MMD); and
    setting a divisor value of the MMD equal to the generated divisor value in response to a current state of the MMD matching a common state for the MMD, the MMD configured to enter the common state regardless of the divisor value loaded by the MMD.

15. The method of claim 14, further comprising determining the common state for the MMD.

16. The method of claim 15, wherein determining the common state for the MMD comprises identifying a state in which the MMD enters regardless of the divisor value.

17. The method of claim 14, further comprising, for each state of the MMD, comparing the state of the MMD to the common state to determine if the state of the MMD matches the common state.

18. The method of claim 14, wherein setting the divisor value equal to the generated divisor value in response to the current state of the MMD matching the common state comprises setting the divisor value equal to the generated divisor value in response to a current state of two unit cells of the MMD being 29.

19. The method of claim 14, wherein setting the divisor value equal to the generated divisor value in response to the current state of the MMD matching the common state comprises setting the divisor value equal to the generated divisor value in response to the current state of the MMD matching the common state and the generated divisor value being equal to or greater than 32.

20. A device, comprising:
    a cascaded multi-modulus frequency divider (MMD) configured to:
       receive a first signal at a first frequency; and
       output a second signal at a second, reduced frequency based on a divisor value; and
    a control circuit configured to convey a generated divisor value to the MMD for loading thereof as the divisor value in response to a detected state of the MMD matching a common state for the MMD, the MMD configured to enter the common state regardless of a value of the divisor value.

* * * * *

UNITED STATES PATENT AND TRADEMARK OFFICE
CERTIFICATE OF CORRECTION

PATENT NO. : 11,018,673 B2
APPLICATION NO. : 16/740278
DATED : May 25, 2021
INVENTOR(S) : Pancham R. Patel and Esmael Heidari It is certified that error appears in the above-identified patent and that said Letters Patent is hereby corrected as shown below:

In the Specification

| | | | |
|---|---|---|---|
| | Column 6, | Line 1, | change "2022" to --202_2-- |
| | Column 6, | Line 17, | change "102_1-102_7" to --202_1-202_7-- |
| | Column 6, | Line 41, | change "3024" to --302_4-- |
| | Column 8, | Line 2, | change "700" to --600-- |
| | Column 8, | Line 7, | change "cell" to --unit cell-- |
| | Column 8, | Line 49, | change "of circuit" to --of MMD-- |
| | Column 9, | Line 18, | change "circuit" to --MMD-- |
| | Column 9, | Line 30, | change "cells 202_3-201_7" to --unit cells 202_3-202_7-- |
| | Column 9, | Line 31, | change "signal 432" to --reset signal 432-- |
| | Column 9, | Line 36, | change "cells 202_6 and 201_7" to --unit cells 202_6 and 202_7-- |
| | Column 9, | Line 38, | change ", signal" to --, reset signal-- |

In the Claims
Claim 11, Column 12, Line 5, change "integer" to --the integer--

Signed and Sealed this
Thirteenth Day of July, 2021

Drew Hirshfeld
*Performing the Functions and Duties of the
Under Secretary of Commerce for Intellectual Property and
Director of the United States Patent and Trademark Office*